(12) United States Patent
Zhao et al.

(10) Patent No.: US 11,191,137 B1
(45) Date of Patent: Nov. 30, 2021

(54) LED DRIVING SYSTEM WITH MASTER-SLAVE ARCHITECTURE

(71) Applicant: Monolithic Power Systems, Inc., San Jose, CA (US)

(72) Inventors: Junjian Zhao, San Jose, CA (US); Chia-Lung Ni, New Taipei (TW); Zheng Luo, San Jose, CA (US); Yu-Huei Lee, New Taipei (TW); Huan Liu, Chengdu (CN)

(73) Assignee: Monolithic Power Systems, Inc., San Jose, CA (US)

( * ) Notice: Subject to any disclaimer, the term of this patent is extended or adjusted under 35 U.S.C. 154(b) by 0 days.

(21) Appl. No.: 17/219,267

(22) Filed: Mar. 31, 2021

Related U.S. Application Data

(63) Continuation-in-part of application No. 17/168,608, filed on Feb. 5, 2021.

(51) Int. Cl.
| | |
|---|---|
| *H05B 45/46* | (2020.01) |
| *H05B 45/14* | (2020.01) |
| *H05B 45/37* | (2020.01) |
| *H03K 19/20* | (2006.01) |
| *H03K 5/24* | (2006.01) |

(52) U.S. Cl.
CPC .............. *H05B 45/14* (2020.01); *H03K 5/24* (2013.01); *H03K 19/20* (2013.01); *H05B 45/37* (2020.01); *H05B 45/46* (2020.01)

(58) Field of Classification Search
CPC combination set(s) only.
See application file for complete search history.

(56) References Cited

U.S. PATENT DOCUMENTS

| | | | | |
|---|---|---|---|---|
| 8,525,423 | B2 | 9/2013 | Yu et al. | |
| 2010/0264837 | A1* | 10/2010 | Zhao | H05B 45/46 |
| | | | | 315/189 |
| 2013/0342124 | A1* | 12/2013 | Huang | H05B 45/38 |
| | | | | 315/210 |

* cited by examiner

*Primary Examiner* — Long Nguyen
(74) *Attorney, Agent, or Firm* — Perkins Coie LLP

(57) ABSTRACT

An LED driving system with a master-slave architecture. The LED driving system has at least two LED driving circuits which both have a first status detecting circuit, a second status detecting circuit and a first feedback control circuit. The first status detecting circuit receives a plurality of headroom detecting voltages provided by a plurality of LED strings and generates at least one self-status signal. The second status detecting circuit receives a downstream feedback signal and generates at least one downstream status signal. The first feedback control circuit generates a first feedback control signal based on the at least one self-status signal and the at least one downstream status signal. The second status detecting circuit of one LED driving circuit is coupled to the first feedback control circuit of the other LED driving circuit.

23 Claims, 6 Drawing Sheets

LED DRIVING SYSTEM WITH MASTER-SLAVE ARCHITECTURE

CROSS-REFERENCE

This application is a continuation-in-part of U.S. patent application Ser. No. 17/168,608, filed on Feb. 5, 2021.

FIELD OF THE INVENTION

The present invention relates generally to electronic circuits, and more particularly but not exclusively to LED (Light Emitting Diode) driving circuits.

BACKGROUND OF THE INVENTION

In LED driving applications, such as in the applications of the dynamic rear lights, the daytime running lights and/or fog lights, a large number of LED strings are needed for lighting. However, a typical LED driving chip can drive only several LED strings, and thus, more than one LED driving chips are usually needed to drive the demanded number of LED strings. Thus, how to control the LED driving chips so that the lighting requirements can be satisfied is needed to be addressed.

SUMMARY

Embodiments of the present invention are directed to an LED (Light Emitting Diode) driving circuit for driving a plurality of LED strings, wherein each LED string has a first terminal and a second terminal, and the plurality of LED strings receive a bias voltage at the first terminals and provide at the second terminals a plurality of headroom detecting voltages having a one-to-one correspondence with the second terminals of the plurality of LED strings, the LED driving circuit comprising: a first status detecting circuit configured to receive the plurality of headroom detecting voltages and to generate at least one self-status signal based on the plurality of headroom detecting voltages; a second status detecting circuit configured to receive a downstream feedback signal and to generate at least one downstream status signal based on the downstream feedback signal, wherein the downstream feedback signal indicates whether a downstream LED driving circuit is coupled to the LED driving circuit or not and further indicates a status of the downstream LED driving circuit if the downstream LED driving circuit is coupled to the LED driving circuit; and a first feedback control circuit configured to generate a first feedback control signal based on the at least one self-status signal and the at least one downstream status signal, wherein the first feedback control signal indicates a status of the LED driving circuit.

Embodiments of the present invention are also directed to an LED (Light Emitting Diode) driving circuit for driving a plurality of LED strings, wherein each LED string has a first terminal and a second terminal, and the plurality of LED strings receive a bias voltage at the first terminals and provide at the second terminals a plurality of headroom detecting voltages having a one-to-one correspondence with the second terminals of the plurality of LED strings, the LED driving circuit comprising: a status detecting circuit configured to receive the plurality of headroom detecting voltages and a downstream feedback signal and to generate at least one status signal based on the plurality of headroom detecting voltages and the downstream feedback signal; a first feedback control circuit configured to generate a first feedback control signal based on the at least one status signal; a second feedback control circuit configured to generate a second feedback control signal based on the at least one status signal; and a selecting circuit configured to receive a mode setting signal, wherein based on the mode setting signal, the selecting circuit is configured to select the first feedback control circuit to output the first feedback control signal or the second feedback control circuit to output the second feedback control signal.

Embodiments of the present invention are further directed to an LED (Light Emitting Diode) driving system, comprising: a first LED driving circuit and a second LED driving circuit with each comprising an LED driving circuit, wherein the LED driving circuit is configured to drive a plurality of LED strings, each LED string has a first terminal and a second terminal, and the plurality of LED strings receive a bias voltage at the first terminals and provide at the second terminals a plurality of headroom detecting voltages having a one-to-one correspondence with the second terminals of the plurality of LED strings, and wherein the LED driving circuit comprises: a first status detecting circuit configured to receive the plurality of headroom detecting voltages and to generate at least one self-status signal based on the plurality of headroom detecting voltages; a second status detecting circuit configured to receive a downstream feedback signal and to generate at least one downstream status signal based on the downstream feedback signal; and a first feedback control circuit configured to generate a first feedback control signal based on the at least one self-status signal and the at least one downstream status signal; wherein the second status detecting circuit of the first LED driving circuit is coupled to the first feedback control circuit of the second LED driving circuit to receive the first feedback control signal provided by the second LED driving circuit as the downstream feedback signal received by the first LED driving circuit.

DESCRIPTION OF THE DRAWINGS

The present invention can be further understood with reference to the following detailed description and the appended drawings, wherein like elements are provided with like reference numerals.

DESCRIPTION

Figure 1:
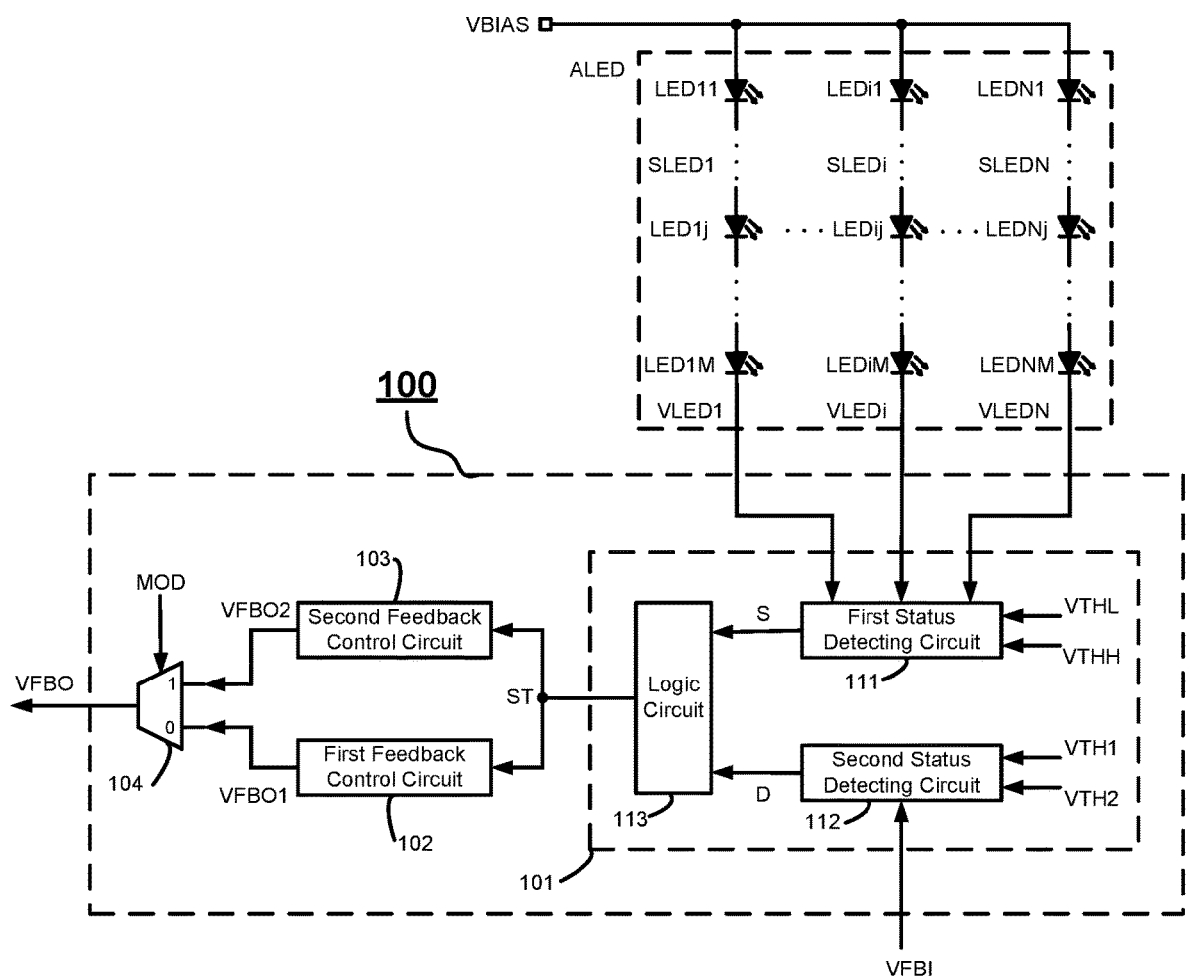
FIG. 1 schematically illustrates an LED driving circuit 100 in accordance with an embodiment of the present invention.

The present invention is now described. While it is disclosed in its preferred form, the specific embodiments of the invention as disclosed herein and illustrated in the drawings are not to be considered in a limiting sense. Rather, these embodiments are provided so that this invention will be thorough and complete, and will fully convey the scope of the invention to those skilled in the art. Indeed, it should be readily apparent in view of the present description that the invention may be modified in numerous ways. Among other things, the present invention may be embodied as devices, methods, software, and so on. Accordingly, the present invention may take the form of an entirely hardware embodiment, an entirely software embodiment or an embodiment combining software and hardware aspects. The following detailed description is, therefore, not to be taken in a limiting sense.

Throughout the invention, the plural forms "a plurality of" and "the plurality of" do not exclude singular reference unless the context clearly dictates otherwise. For example, the term "a plurality of LED strings" or "the plurality of LED strings" may include only one LED string. For another example, the term "a plurality of LEDs" or "the plurality of LEDs" may include only one LED. In addition, throughout the invention, the meaning of "a," "an," and "the" may also include plural references.

FIG. 1 schematically illustrates an LED driving circuit 100 in accordance with an embodiment of the present invention. As shown in FIG. 1, the LED (Light Emitting Diode) driving circuit 100 is configured to drive an LED array ALED. The LED array ALED comprises a plurality of LED strings SLED1 ... SLEDi ... SLEDN, wherein i represents an integer in the range of 1 to N and N represents an integer greater than or equal to 1. And the LED string SLEDi comprises a plurality of LEDs LEDi1 ... LEDij ... LEDiM with each LED having a first terminal (e.g. anode) and a second terminal (e.g. cathode), wherein j represents an integer in the range of 1 to M and M represents an integer greater than or equal to 1. The first terminals of the LEDs LEDi2 ... LEDiM are coupled to the second terminals of the LEDs LEDi1 ... LEDi(M−1) in a one-to-one correspondence as shown, the first terminal of the LEDi1 is configured to receive a bias voltage VBIAS as an input power supply, and the second terminal of the LEDiM is configured to provide a headroom detecting voltage VLEDi. The LED driving circuit 100 is configured to regulate an LED current flowing through each LED string so as to keep the LED current in a desired value.

As shown in FIG. 1, the LED driving circuit 100 is configured to comprise a status detecting circuit 101 and a first feedback control circuit 102. The status detecting circuit 101 is coupled to the plurality of LED strings SLED1 ... SLEDi ... SLEDN to receive a plurality of headroom detecting voltages VLED1 ... VLEDi ... VLEDN. The status detecting circuit 101 also receives a downstream feedback signal VFBI. And based on the downstream feedback signal VFBI and the plurality of headroom detecting voltages VLED1 ... VLEDi ... VLEDN, the status detecting circuit 101 generates at least one status signal ST.

In one embodiment, as will become more apparent later, the downstream feedback signal VFBI is used to indicate whether a downstream LED driving circuit is coupled to the LED driving circuit 100 or not and to further indicate a status of the downstream LED driving circuit if the downstream LED driving circuit is coupled to the LED driving circuit 100. In one embodiment, the downstream LED driving circuit has the same configuration as that of the LED driving circuit 100. In other words, the downstream LED driving circuit comprises the same components and the same interconnection among those components as those of the LED driving circuit 100.

The first feedback control circuit 102 is coupled to the status detecting circuit 101 to receive the at least one status signal ST, and based on the at least one status signal ST, the first feedback control circuit 102 generates a first feedback control signal VFBO1. In one embodiment, the first feedback control signal VFBO1 indicates a status of the LED driving circuit 100.

In one embodiment, the status of the LED driving circuit 100 comprises: 1) a state that the bias voltage VBIAS is larger than the voltage required for driving the plurality of LED strings SLED1 ... SLEDi ... SLEDN so as to keep the LED current flowing through each LED string SLEDi in the desired value and meanwhile a bias voltage supplying a plurality of LED strings driven by the downstream LED driving circuit is larger than the voltage required for driving the plurality of LED strings driven by the downstream LED driving circuit so as to keep an LED current flowing through each LED string driven by the downstream LED driving circuit in a desired value; 2) a state that the bias voltage VBIAS is appropriate for driving the plurality of LED strings SLED1 ... SLEDi ... SLEDN so as to keep the LED current flowing through each LED string SLEDi in the desired value and meanwhile the bias voltage supplying the plurality of LED strings driven by the downstream LED driving circuit is appropriate for driving the plurality of LED strings driven by the downstream LED driving circuit so as to keep the LED current flowing through each LED string driven by the downstream LED driving circuit in the desired value; or 3) a state that the bias voltage VBIAS is less than the voltage required for driving the plurality of LED strings SLED1 ... SLEDi ... SLEDN so as to keep the LED current flowing through each LED string SLEDi in the desired value or the bias voltage supplying the plurality of LED strings driven by the downstream LED driving circuit is less than the voltage required for driving the plurality of LED strings driven by the downstream LED driving circuit so as to keep the LED current flowing through each LED string driven by the downstream LED driving circuit in the desired value. The aforementioned statements regarding the status of the LED driving circuit 100 may also apply to the status of the downstream LED driving circuit.

In one embodiment, the first feedback control signal VFBO1 and the downstream feedback signal VFBI have the same value when the LED driving circuit 100 and the downstream LED driving circuit has the same status.

In one embodiment, the LED driving circuit 100 may further comprise a second feedback control circuit 103 and a selecting circuit 104. The second feedback control circuit 103 is coupled to the status detecting circuit 101 to receive the at least one status signal ST, and based on the at least one status signal ST, the second feedback control circuit 103 generates a second feedback control signal VFBO2.

The selecting circuit 104 is configured to receive a mode setting signal MOD, and based on the mode setting signal MOD, the selecting circuit 104 is configured to select the second feedback control circuit 103 to output the second feedback control signal VFBO2 as a feedback control signal VFBO of the LED driving circuit 100 or to select the first feedback control circuit 102 to output the first feedback control signal VFBO1 as the feedback control signal VFBO of the LED driving circuit 100.

In one embodiment, the mode setting signal MOD has a first state and a second state, e.g., the mode setting signal MOD is in the first state when it is coupled to a ground voltage and is in the second state when it is coupled to a power supply voltage. When the mode setting signal MOD is in the first state, the second feedback control circuit 103 is selected to output the second feedback control signal VFBO2 as the feedback control signal VFBO and the LED driving circuit 100 is configured as a master LED driving circuit; and when the mode setting signal MOD is in the second state, the first feedback control circuit 102 is selected to output the first feedback control signal VFBO1 as the feedback control signal VFBO and the LED driving circuit 100 is configured as a slave LED driving circuit. The operation of the master LED driving circuit and of the slave LED driving circuit will become more apparent later.

Figure 9:
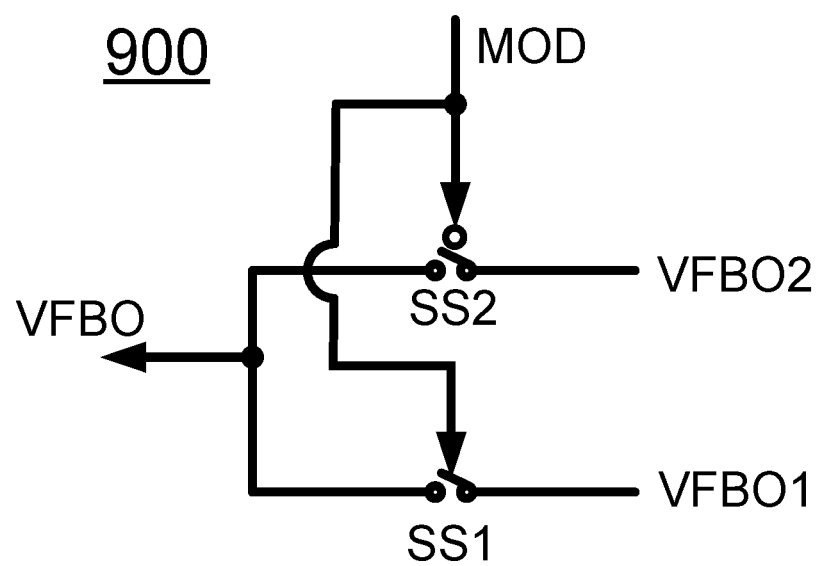
FIG. 9 schematically illustrates a selecting circuit 900 in accordance with an embodiment of the present invention.

FIG. 9 schematically illustrates a selecting circuit 900 in accordance with an embodiment of the present invention. As shown in FIG. 9, the selecting circuit 900 comprises two switches SS1 and SS2 with each having a first terminal, a second terminal and a control terminal. The first terminals of the switches SS1 and SS2 are respectively configured to receive the first feedback control signal VFBO1 and the second feedback control signal VFBO2, the control terminals of the switches SS1 and SS2 are respectively configured to receive the mode setting signal MOD and an inverse signal of the mode setting signal MOD, and the second terminals of the switches SS1 and SS2 are coupled together to provide a feedback control signal VFBO. In operation, when the mode setting signal MOD is in a first state, the switch SS1 is turned off and the switch SS2 is turned on so as to output the second feedback control signal VFBO2 as the feedback control signal VFBO; when the mode setting signal MOD is in a second state, the switch SS1 is turned on and the switch SS2 is turned off so as to output the first feedback control signal VFBO1 as the feedback control signal VFBO. In one embodiment, the switches SS1 and SS2 are implemented with N type MOSFETs.

Further referring to FIG. 1, the status detecting circuit 101 may comprise a first status detecting circuit 111 and a second status detecting circuit 112. The first status detecting circuit 111 is coupled to the plurality of LED strings SLED1 . . . SLEDi . . . SLEDN to receive the plurality of headroom detecting voltages VLED1 . . . VLEDi . . . VLEDN, and based on the plurality of headroom detecting voltages VLED1 . . . VLEDi . . . VLEDN, the first status detecting circuit 111 generates at least one self-status signal S. The second status detecting circuit 112 is configured to receive the downstream feedback signal VFBI and to generate at least one downstream status signal D based on the downstream feedback signal VFBI. The status detecting circuit 101 is configured to generate the at least one status signal ST based on the at least one self-status signal S and the at least one downstream status signal D.

In one embodiment, the first status detecting circuit 111 further receives a high headroom threshold voltage VTHH and a low headroom threshold voltage VTHL, and the first status detecting circuit 111 is configured to generate the at least one self-status signal S based on comparing each of the plurality of headroom detecting voltages VLED1 . . . VLEDi . . . VLEDN with the high headroom threshold voltage VTHH and the low headroom threshold voltage VTHL. Yet in another embodiment, the second status detecting circuit 112 is configured to further receive a low downstream threshold voltage VTH1 and a high downstream threshold voltage VTH2 and to generate the at least one downstream status signal D based on comparing the downstream feedback signal VFBI with the low downstream threshold voltage VTH1 and the high downstream threshold voltage VTH2.

In one embodiment, the at least one self-status signal S comprises an up self-status signal UP_S and a down self-status signal DOWN_S, and the first status detecting circuit 111 is configured to generate the up self-status signal UP_S based on comparing each headroom detecting voltage VLEDi with the low headroom threshold voltage VTHL and to generate the down self-status signal DOWN_S based on comparing each headroom detecting voltage VLEDi with the high headroom threshold voltage VTHH. In one embodiment, the up self-status signal UP_S is in an active state when any of the plurality of headroom detecting voltages VLED1 . . . VLEDi . . . VLEDN is lower than the low headroom threshold voltage VTHL, the down self-status signal DOWN_S is in an active state when each of the plurality of headroom detecting voltages VLED1 . . . VLEDi . . . VLEDN is higher than the high headroom threshold voltage VTHH, and the up self-status signal UP_S is in a non-active state and the down self-status signal DOWN_S is in a non-active state when each of the plurality of headroom detecting voltages VLED1 . . . VLEDi . . . VLEDN is between the low headroom threshold voltage VTHL and the high headroom threshold voltage VTHH.

Yet in another embodiment, the at least one downstream status signal D comprises an up downstream status signal UP_D and a down downstream status signal DOWN_D, and the second status detecting circuit 112 is configured to generate the up downstream status signal UP_D based on comparing the downstream feedback signal VFBI with the high downstream threshold voltage VTH2 and to generate the down downstream status signal DOWN_D based on comparing the downstream feedback signal VFBI with the low downstream threshold voltage VTH1. In one embodiment, the up downstream status signal UP_D is in an active state when the downstream feedback signal VFBI is higher than the high downstream threshold voltage VTH2, the down downstream status signal DOWN_D is in an active state when the downstream feedback signal VFBI is lower than the low downstream threshold voltage VTH1, and the up downstream status signal UP_D is in a non-active state and the down downstream status signal DOWN_D is in a non-active state when the downstream feedback signal VFBI is between the low downstream threshold voltage VTH1 and the high downstream threshold voltage VTH2.

Figure 2:
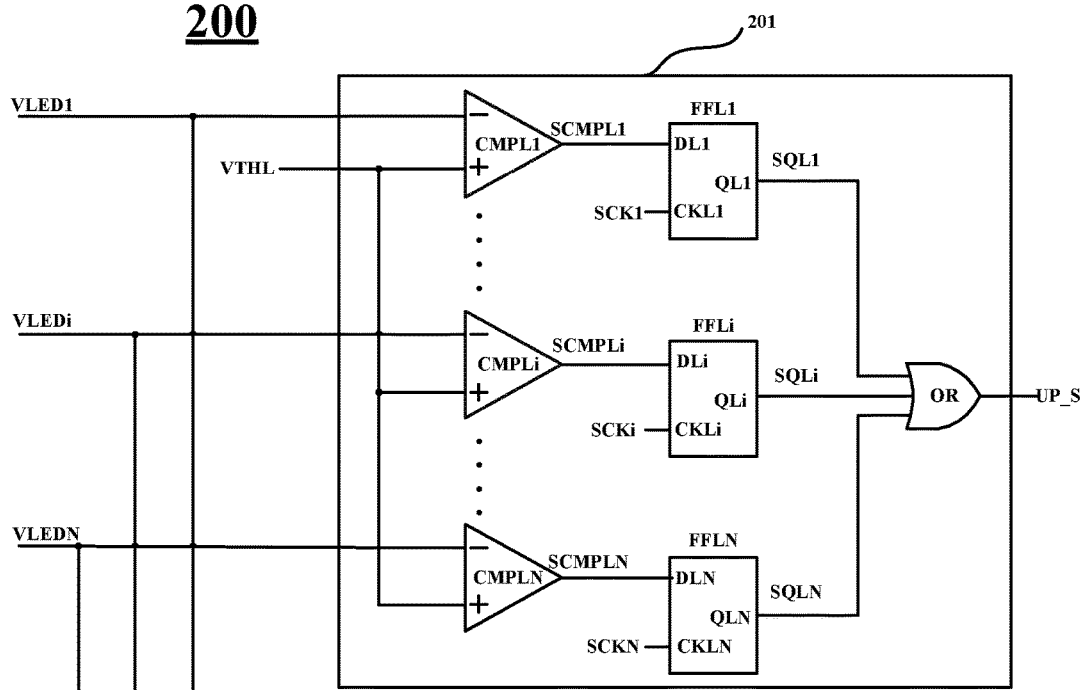
FIG. 2 schematically illustrates an exemplary first status detecting circuit 200 in accordance with an embodiment of the present invention.
Figure 2:
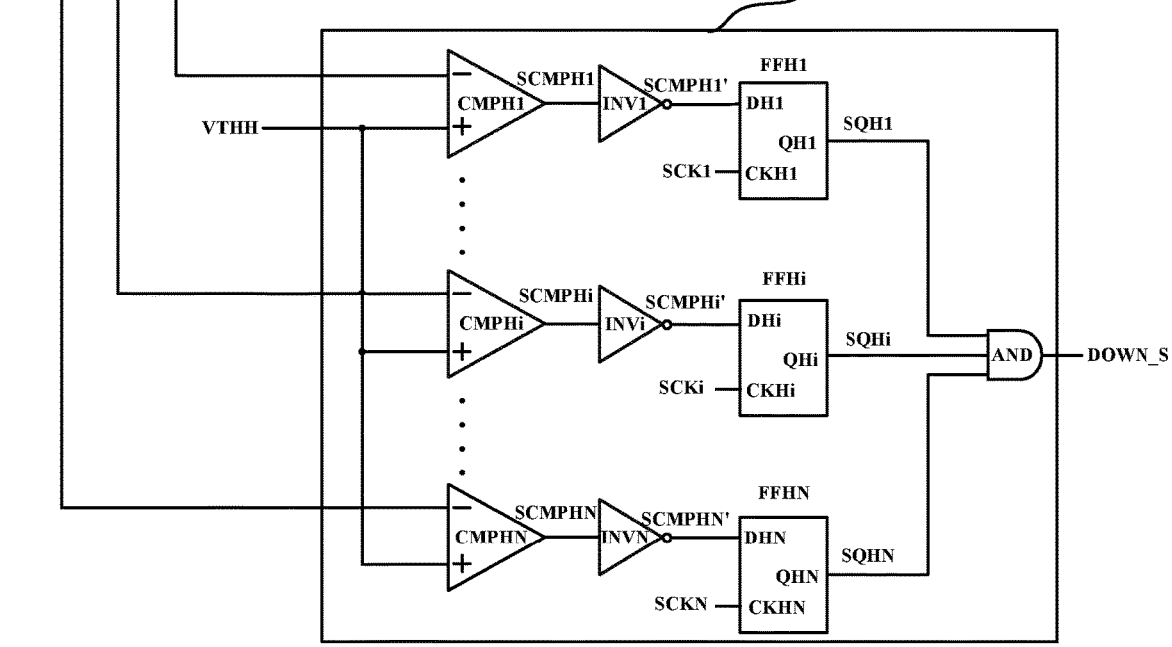

FIG. 2 schematically illustrates an exemplary first status detecting circuit 200 in accordance with an embodiment of the present invention. As shown in FIG. 2, the first status detecting circuit 200 is configured to comprise an up status detecting circuit 201 and a down status detecting circuit 202. The up status detecting circuit 201 is configured to receive the plurality of headroom detecting voltages VLED1 . . . VLEDi . . . VLEDN and the low headroom threshold voltage VTHL, and to generate the up self-status signal UP_S by comparing the plurality of headroom detecting voltages VLED1 . . . VLEDi . . . VLEDN with the low headroom threshold voltage VTHL. More particularly, the up self-status signal UP_S is in an active state (e.g. logic "1") when any of the plurality of headroom detecting voltages VLED1 . . . VLEDi . . . VLEDN is lower than the low headroom threshold voltage VTHL, and the up self-status signal UP_S is in a non-active state (e.g. logic "0") when none of the plurality of headroom detecting voltages VLED1 . . . VLEDi . . . VLEDN is lower than the low headroom threshold voltage VTHL.

Further referring to FIG. 2, the up status detecting circuit 201 is configured to comprise a plurality of up comparators CMPL1 . . . CMPLi . . . CMPLN, a plurality of up flip-flops FFL1 . . . FFLi . . . FFLN, and an OR gate. The up comparator CMPLi has a first input terminal, a second input terminal and an output terminal, wherein the first input terminal is configured to receive the corresponding headroom detecting voltage VLEDi, the second input terminal is configured to receive the low headroom threshold voltage VTHL. In one embodiment, the first input terminal of the up comparator CMPLi is an inverting input terminal and the second input terminal of the up comparator CMPLi is a non-inverting input terminal. The up comparator CMPi compares the headroom detecting voltage VLEDi with the low headroom threshold voltage VTHL and generates an up comparison signal SCMPLi at the output terminal, wherein the up comparison signal SCMPLi is in an active state (e.g., logic "1") when the headroom detecting voltage VLEDi is lower than the low headroom threshold voltage VTHL, and the up comparison signal SCMPLi is in a non-active state (e.g., logic "0") when the headroom detecting voltage VLEDi is not lower than the low headroom threshold voltage VTHL.

The up flip-flop FFLi has a first input terminal DLi and an output terminal QLi, wherein the up flip-flop FFLi is configured to receive the corresponding up comparison signal SCMPLi at the first input terminal DLi and to generate an up flip-flop signal SQLi based on the up comparison signal SCMPLi. Further referring to FIG. 2, the up flip-flop FFLi may further comprise a second input terminal CKLi for receiving a clock signal SCKi. In operation, the up flip-flop FFLi samples the state of the up comparison signal SCMPLi when the clock signal SCKi is in an active state (e.g., transition from logic "1" to logic "0") and then holds the sampled state of the up comparison signal SCMPLi, the up flip-flop FFLi outputs the sampled and held state as the up flip-flop signal SQLi. Thus, the up flip-flop signal SQLi is in an active state (e.g., logic "1") when the sampled up comparison signal SCMPLi is in the active state, and in a non-active state (e.g., logic "0") when the sampled up comparison signal SCMPLi is in the non-active state. In one embodiment, the clock signal SCKi may be a pulse width modulation signal used for regulating the LED current flowing through the LED string LEDi to accomplish the PWM dimming function.

The OR gate has a plurality of input terminals in a one-to-one correspondence with the plurality of up flip-flops FFL1 . . . FFLi . . . FFLN and an output terminal. The OR gate is configured to receive the plurality of up flip-flop signals SQL1 . . . SQLi . . . SQLN generated by the plurality of up flip-flops FFL1 . . . FFLi . . . FFLN and to output the up self-status signal UP_S at the output terminal based on the plurality of up flip-flop signals SQL1 . . . SQLi . . . SQLN. The OR gate generates the up self-status signal UP_S by implementing a logical disjunction on the plurality of up flip-flop signals SQL1 . . . SQLi . . . SQLN. Thus, the up self-status signal UP_S is in the active state when any of the plurality of up flip-flop signals SQL1 . . . SQLi . . . SQLN is in the active state, and in the non-active state when none of the plurality of up flip-flop signals SQL1 . . . SQLi . . . SQLN is in the active state.

Still referring to FIG. 2, the down status detecting circuit 202 is configured to receive the plurality of headroom detecting voltages VLED1 . . . VLEDi . . . VLEDN and the high headroom threshold voltage VTHH, and to generate the down self-status signal DOWN_S by comparing the plurality of headroom detecting voltages VLED1 . . . VLEDi . . . VLEDN with the high headroom threshold voltage VTHH. More particularly, the down self-status signal DOWN_S is in an active state (e.g., logic "0") when each of the plurality of headroom detecting voltages VLED1 . . . VLEDi . . . VLEDN is higher than the high headroom threshold voltage VTHH, and the down self-status signal DOWN_S is in a non-active state (e.g., logic "1") when any of the plurality of headroom detecting voltages VLED1 . . . VLEDi . . . VLEDN is not higher than the high headroom threshold voltage VTHH.

Further referring to FIG. 2, the down status detecting circuit 202 is configured to comprise a plurality of down comparators CMPH1 . . . CMPHi . . . CMPHN, a plurality of inverters INV1 . . . INVi . . . INVN, a plurality of down flip-flops FFH1 . . . FFHi . . . FFHN, and an AND gate. The down comparator CMPHi has a first input terminal, a second input terminal and an output terminal, wherein the first input terminal is configured to receive the corresponding headroom detecting voltage VLEDi, the second input terminal is configured to receive the high headroom threshold voltage VTHH. In one embodiment, the first input terminal of the down comparator CMPHi is an inverting input terminal and the second input terminal of the down comparator CMPHi is a non-inverting input terminal. The down comparator CMPi compares the headroom detecting voltages VLEDi with the high headroom threshold voltage VTHH and generates a down comparison signal SCMPHi at the output terminal, wherein the down comparison signal SCMPHi is in an active state (e.g., logic "0") when the headroom detecting voltage VLEDi is higher than the high headroom threshold voltage VTHH, and in a non-active state (e.g., logic "1") when the headroom detecting voltage VLEDi is not higher than the high headroom threshold voltage VTHH.

The inverter INVi has an input terminal and an output terminal, wherein the inverter INVi is configured to receive the down comparison signal SCMPHi at the input terminal and to invert the down comparison signal SCMPHi so as to output an inverted down comparison signal SCMPHi' which is the inverted signal of the down comparison signal SCMPHi at the output terminal. The inverted down comparison signal SCMPHi' is in an active state (e.g., logic "1") when the down comparison signal SCMPHi is in the active state and the inverted down comparison signal SCMPHi' is in a non-active state (e.g., logic "0") when the down comparison signal SCMPHi is in the active state.

The down flip-flop FFHi has a first input terminal DHi and an output terminal QHi, wherein the down flip-flop FFHi is configured to receive the corresponding inverted down comparison signal SCMPHi' at the first input terminal DHi and to generate a down flip-flop signal SQHi based on the inverted down comparison signal SCMPHi'. Further referring to FIG. 2, the down flip-flop FFHi may further comprise a second input terminal CKHi for receiving the clock signal SCKi. In operation, the down flip-flop FFHi samples the state of the inverted down comparison signal SCMPHi' when the clock signal SCKi is in the active state and then holds the state of the inverted down comparison signal SCMPHi', the down flip-flop FFHi outputs the sampled and held state as the down flip-flop signal SQHi. Thus, the down flip-flop signal SQHi is in an active state when the sampled down comparison signal SCMPHi is in the active state, and in a non-active state when the sampled down comparison signal SCMPHi is in the non-active state.

The AND gate has a plurality of input terminals in a one-to-one correspondence with the plurality of down flip-flops FFH1 . . . FFHi . . . FFHN and an output terminal. The AND gate is configured to receive the plurality of down flip-flop signals SQH1 . . . SQHi . . . SQHN generated by the plurality of down flip-flops FFH1 . . . FFHi . . . FFHN and to output the down self-status signal DOWN_S at the output terminal based on the plurality of down flip-flop signals SQH1 . . . SQHi . . . SQHN. The AND gate generates the down self-status signal DOWN_S by implementing a logical conjunction on the plurality of down flip-flop signals SQH1 . . . SQHi . . . SQHN. Thus, the down self-status signal DOWN_S is in the active state when all of the plurality of down flip-flop signals SQH1 . . . SQHi . . . SQHN are in their active states, and in the non-active state when any of the plurality of down flip-flop signals SQH1 . . . SQHi . . . SQHN is in the non-active state.

Persons of ordinary skill in the art will recognize that the first status detecting circuit 200 is only for illustration and should not be construed as limiting the present invention in any manner, in another embodiment, the first status detecting circuit 111 of FIG. 1 may be contemplated with a different configuration other than that shown in FIG. 2. For example, two pluralities of comparators are illustrated in FIG. 2 to respectively accomplish the foregoing up comparison functionality and the foregoing down comparison functionality, however, in another embodiment, only one plurality of comparators may be used to accomplish both the up comparison functionality and the down comparison functionality. In such the embodiment, each comparator may have a first input terminal, a second input terminal, a third input terminal and an output terminal. The first input terminal is configured to receive the corresponding headroom detecting voltage, the second input terminal is configured to receive the low headroom threshold voltage, and the third input terminal is configured to receive the high headroom threshold voltage. The comparator compares the corresponding headroom detecting voltage with the low headroom threshold voltage and the high headroom threshold voltage and generates a comparison signal accordingly. The comparison signal is then fed into the downstream components to respectively generate the up self-status signal UP_S and the down self-status signal DOWN_S.

Figure 3:
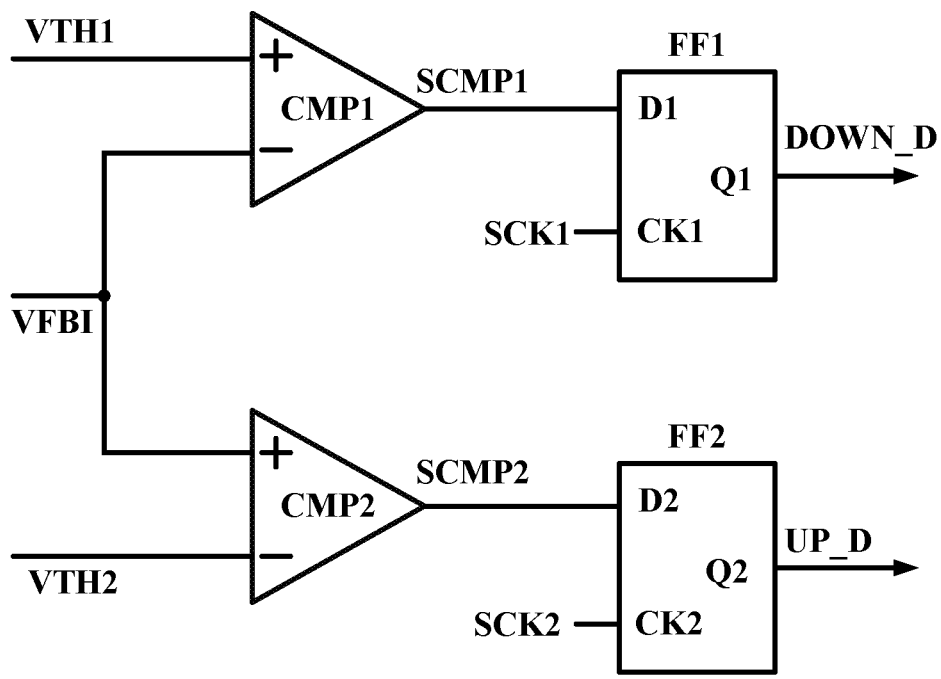
FIG. 3 schematically illustrates an exemplary second status detecting circuit 300 in accordance with an embodiment of the present invention.

FIG. 3 schematically illustrates an exemplary second status detecting circuit 300 in accordance with an embodiment of the present invention. As shown in FIG. 3, the second status detecting circuit 300 is configured to comprise a first comparator CMP1 and a second comparator CMP2. The first comparator CMP1 has a first input terminal, a second input terminal and an output terminal, wherein the first input terminal is configured to receive a downstream feedback signal VFBI, the second input terminal is configured to receive the low downstream threshold voltage VTH1. In one embodiment, the first input terminal of the first comparator CMP1 is an inverting input terminal and the second input terminal of the first comparator CMP1 is a non-inverting input terminal. The first comparator CMP1 compares the downstream feedback signal VFBI with the low downstream threshold voltage VTH1 and generates a first comparison signal SCMP1 at the output terminal, wherein the first comparison signal SCMP1 is in an active state (e.g., logic "1") when the downstream feedback signal VFBI is lower than the low downstream threshold voltage VTH1, and the first comparison signal SCMP1 is in a non-active state (e.g., logic "0") when the downstream feedback signal VFBI is higher than the low downstream threshold voltage VTH1.

The second comparator CMP2 has a first input terminal, a second input terminal and an output terminal, wherein the first input terminal is configured to receive the downstream feedback signal VFBI, the second input terminal is configured to receive the high downstream threshold voltage VTH2. In one embodiment, the first input terminal of the second comparator CMP2 is a non-inverting input terminal and the second input terminal of the second comparator CMP2 is an inverting input terminal. The second comparator CMP2 compares the downstream feedback signal VFBI with the high downstream threshold voltage VTH2 and generates a second comparison signal SCMP2 at the output terminal, wherein the second comparison signal SCMP2 is in an active state (e.g., logic "0") when the downstream feedback signal VFBI is higher than the high downstream threshold voltage VTH2, and the second comparison signal SCMP2 is in a non-active state (e.g., logic "1") when the downstream feedback signal VFBI is lower than the high downstream threshold voltage VTH2.

Further referring to FIG. 3, the second status detecting circuit 300 is configured to further comprise a first flip-flop FF1 and a second flip-flop FF2. The first flip-flop FF1 has a first input terminal D1 and an output terminal Q1, wherein the first flip-flop FF1 is configured to receive the first comparison signal SCMP1 at the first input terminal D1 and to generate the down downstream status signal DOWN_D based on the first comparison signal SCMP1. Further referring to FIG. 3, the first flip-flop FF1 may further comprise a second input terminal CK1 for receiving a clock signal SCK1. In operation, the first flip-flop FF1 samples the state of the first comparison signal SCMP1 when the clock signal SCK1 is in an active state (e.g., transition from logic "1" to logic "0") and then holds the sampled state of the first comparison signal SCMP1, the first flip-flop FF1 outputs the sampled and held state as the state of the down downstream status signal DOWN_D. Thus, the down downstream status signal DOWN_D is in an active state (e.g., logic "1") when the sampled first comparison signal SCMP1 is in the active state, and in a non-active state (e.g., logic "0") when the sampled first comparison signal SCMP1 is in the non-active state. In one embodiment, the clock signal SCK1 may be a pulse width modulation signal used for regulating the LED current flowing through the LED string LEDi to accomplish the PWM dimming function.

The second flip-flop FF2 has a first input terminal D2 and an output terminal Q2, wherein the second flip-flop FF2 is configured to receive the second comparison signal SCMP2 at the first input terminal D2 and to generate the up downstream status signal UP_D based on the second comparison signal SCMP2. Further referring to FIG. 3, the second flip-flop FF2 may further comprise a second input terminal CK2 for receiving the clock signal SCK2. In operation, the second flip-flop FF2 samples the state of the second comparison signal SCMP2 when the clock signal SCK2 is in an active state (e.g., transition from logic "1" to logic "0") and then holds the sampled state of the second comparison signal SCMP2, the second flip-flop FF2 outputs the sampled and held state as the state of the up downstream status signal UP_D. Thus, the up downstream status signal UP_D is in an active state (e.g., logic "1") when the sampled second comparison signal SCMP2 is in the active state, and in a non-active state (e.g., logic "0") when the sampled second comparison signal SCMP2 is in the non-active state.

In one embodiment, for example, in the embodiment where the at least one self-status signal S comprises an up self-status signal UP_S and a down self-status signal DOWN_S and the at least one downstream status signal D comprises an up downstream status signal UP_D and a down downstream status signal DOWN_D, the at least one status signal ST comprises an up status signal UP and a down status signal DOWN, and the status detecting circuit 101 generates the up status signal UP based on the up self-status signal UP_S and the up downstream status signal UP_D and generates the down status signal DOWN based on the down self-status signal DOWN_S and the down downstream status signal DOWN_D. The up status signal UP is in an active state when any of the headroom detecting voltages VLED1 ... VLEDi ... VLEDN is lower than a low headroom threshold voltage VTHL or when the downstream feedback signal VFBI is higher than a high downstream threshold voltage VTH2, and the down status signal DOWN is in an active state when each of the headroom detecting voltages VLED1 ... VLEDi ... VLEDN is higher than a high headroom threshold voltage VTHH and when the downstream feedback signal VFBI is lower than a low downstream threshold voltage VTH1, and the up status signal UP is in a non-active state and the down status signal DOWN is in a non-active state when each of the headroom detecting voltages VLED1 ... VLEDi ... VLEDN is between the low headroom threshold voltage VTHL and the high headroom threshold voltage VTHH and when the downstream feedback signal VFBI is between the low downstream threshold voltage VTH1 and the high downstream threshold voltage VTH2. In such the embodiment, the first feedback control circuit 102 generates the first feedback control signal VFBO1 based on the up status signal UP and the down status signal DOWN.

Further referring to FIG. 1, the status detecting circuit 101 may further comprise a logic circuit 113. The logic circuit 113 is coupled to the first status detecting circuit 111 to receive the up self-status signal UP_S and the down self-status signal DOWN_S and is also coupled to the second status detecting circuit 112 to receive the up downstream status signal UP_D and the down downstream status signal DOWN_D, based on the up self-status signal UP_S and the up downstream signal UP_D, the logic circuit 113 is configured to generate the up status signal UP, and based on the down self status signal DOWN_S and the down downstream status signal DOWN_D, the logic circuit 113 is configured to generate the down status signal DOWN.

Figure 4:
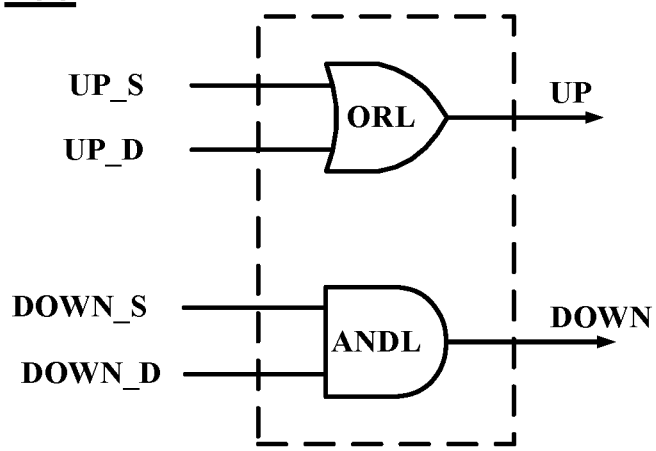
FIG. 4 schematically illustrates a logic circuit 400 in accordance with an embodiment of the present invention.

FIG. 4 schematically illustrates a logic circuit 400 in accordance with an embodiment of the present invention. In the embodiment, the at least one self-status signal S comprises an up self-status signal UP_S and a down self-status signal DOWN_S and the at least one downstream status signal D comprises an up downstream status signal UP_D and a down downstream status signal DOWN_D. Referring to FIG. 4, the logic circuit 400 comprises an OR circuit ORL and an AND gate ANDL. The OR circuit ORL has a first input terminal to receive the up self-status signal UP_S and a second input terminal to receive the up downstream status signal UP_D. The OR circuit ORL generates an up status signal UP by implementing a logical disjunction on the up self-status signal UP_S and the up downstream status signal UP_D. The AND circuit ANDL has a first input terminal to receive the down self-status signal DOWN_S and a second input terminal to receive the down downstream status signal DOWN_D. The AND circuit ANDL generates a down status signal DOWN by implementing a logical conjunction on the down self-status signal DOWN_S and the down downstream status signal DOWN_D.

Figure 5:
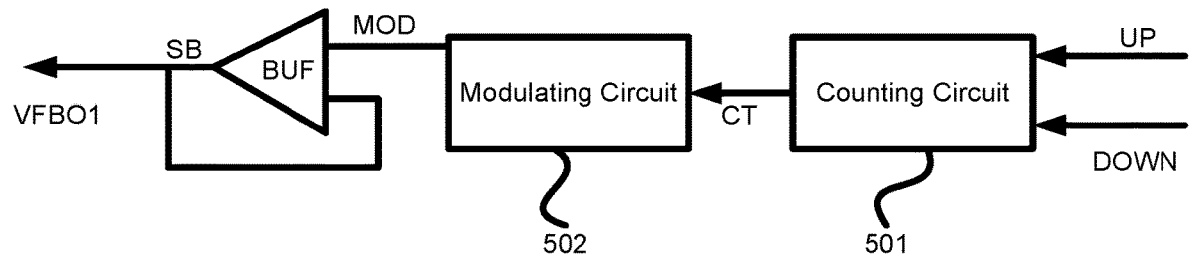
FIG. 5 schematically illustrates a second feedback control circuit 500 in accordance with an embodiment of the present invention.

FIG. 5 schematically illustrates a second feedback control circuit 500 in accordance with an embodiment of the present invention. As shown in FIG. 5, the second feedback control circuit 500 is configured to comprise a counting circuit 501, a modulating circuit 502 and a buffer BUF.

The counting circuit 501 is configured to receive the up status signal UP and the down status signal DOWN and is configured to generate a counting signal CT based on the up status signal UP and the down status signal DOWN. More specifically, the counting signal CT counts in a first direction or in a second direction opposite to the first direction or keeps unchanged based on the up status signal UP and the down status signal DOWN.

Persons of ordinary skill in the art will recognize that, in one embodiment, the first direction may be an up direction in which the counting signal CT counts up, while the second direction may be a down direction in which the counting signal CT counts down. Yet in another embodiment, the first direction may be a down direction in which the counting signal CT counts down, while the second direction may an up direction in which the counting signal CT counts up. Further in one embodiment, the counting signal CT may be a digital signal.

The modulating circuit 502 is coupled to the counting circuit 501 to receive the counting signal CT and is configured to generate a modulating signal MOD based on the counting signal CT, wherein the modulating signal MOD varies with the counting signal CT. More specifically, the modulating signal MOD increases, decreases or keeps unchanged based on the counting signal CT. In one embodiment, the modulating signal is a voltage signal.

The buffer BUF has a first input terminal, a second input terminal and an output terminal, wherein the first input terminal is coupled to the modulating circuit 502 to receive the modulating signal MOD, and the output terminal is coupled to the second input terminal and is configured to provide a buffer signal SB based on the modulating signal MOD. In the embodiment as shown in FIG. 5, the buffer signal SB is output as the feedback control signal VFBO. Yet in another embodiment, the feedback control signal VFBO is generated by taking a further operation on the buffer signal SB. In one embodiment, the first input terminal is a non-inverting input terminal, and the second input terminal is an inverting input terminal.

In operation, the up status signal UP is in an active state (e.g. logic "1") when any of the headroom detecting voltages VLED1 ... VLEDi ... VLEDN is lower than the low headroom threshold voltage VTHL or the downstream feedback signal VFBI is higher than the high downstream threshold voltage VTH2, the down status signal DOWN is in an active state (e.g. logic "1") when each of the headroom detecting voltages VLED1 ... VLEDi ... VLEDN is higher than the high headroom threshold voltage VTHH and the downstream feedback signal VFBI is lower than the low downstream threshold voltage VTH1, and the up status signal UP is in a non-active state (e.g. logic "0") and the down status signal DOWN is in a non-active state (e.g. logic "0") when each of the headroom detecting voltages VLED1 ... VLEDi ... VLEDN is between the low headroom threshold voltage VTHL and the high headroom threshold voltage VTHH and the downstream feedback signal VFBI is between the low downstream threshold voltage VTH1 and the high downstream threshold voltage VTH2. The counting signal CT counts in the first direction (e.g. an up direction) when the up status signal UP is in the active state, the counting signal CT counts in the second direction (e.g. a down direction) when the down status signal DOWN is in the active state, the counting signal CT keeps unchanged when the up status signal UP is in the non-active state and the down status signal DOWN is in the non-active state. The modulating signal MOD decreases when the counting signal CT counts in the first direction, the modulating signal MOD increases when the counting signal CT counts in the second direction, and the modulating signal MOD keeps unchanged when the counting signal CT keeps unchanged.

Table 1 illustrates the operation of an exemplary counting circuit 112T in accordance with an embodiment of the present invention. The counting circuit 112T is configured to receive the up status signal UP and the down status signal DOWN. Based on the up status signal UP and the down status signal DOWN, the counting circuit 112T outputs a counting signal CT consisting of L sequential digital bits D[L−1] . . . D[0] as shown in Table 1, wherein L is an integer greater than 0. More specifically, the counting circuit 112T increases one of the digital bits D[L−1] . . . D[0] depending on its present state when the up status signal UP is in the active state (e.g., logic "1"). In contrast, the counting circuit 112T decreases one of the digital bits D[L−1] . . . D[0] depending on its present state when the down status signal DOWN is in the active state (e.g., logic "1"). And the counting circuit 112T maintains the digital bits D[L−1] . . . D[0] when both the up status signal UP and the down status signal DOWN are respectively in their non-active states (e.g., logic "0"). Taking L=8 for example, as shown in Table 1, the counting circuit 112T has 256 states S1 . . . S256. Supposing the counting circuit 112T is currently in state S2 in which the counting signal CT is 00000001, the counting signal CT will increase to 00000010 when the up status signal UP is in the active state, the counting signal CT will decrease to 00000000 when the down status signal DOWN is in the active state, and the counting signal CT will maintain at 00000001 when both the up status signal UP and the down status signal DOWN are respectively in their non-active states. In addition, the counting circuit 112T may be further configured to receive a counting clock signal, and during an active state of the counting clock signal (e.g. transition from logic "0" to logic "1"), the counting circuit 112T increases one of the digital bits D[L−1] . . . D[0] when the up status signal UP is in the active state (e.g., logic "1"), and the counting circuit 112T decreases one of the digital bits D[L−1] . . . D[0] when the down status signal DOWN is in the active state (e.g., logic "1").

TABLE 1

| State | D[L−1] | D[6] | D[5] | ... | ... | D[2] | D[1] | D[0] |
|---|---|---|---|---|---|---|---|---|
| S1 | 0 | 0 | 0 | 0 | 0 | 0 | 0 | 0 |
| S2 | 0 | 0 | 0 | 0 | 0 | 0 | 0 | 1 |
| S3 | 0 | 0 | 0 | 0 | 0 | 0 | 1 | 0 |
| ... | ... | ... | ... | ... | ... | ... | ... | ... |
| S255 | 0 | 1 | 1 | 1 | 1 | 1 | 1 | 1 |
| S256 | 1 | 1 | 1 | 1 | 1 | 1 | 1 | 1 |

Figure 6:
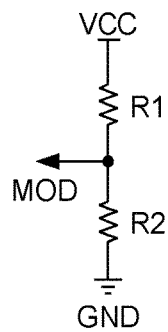
FIG. 6 schematically illustrates an exemplary modulating circuit in accordance with an embodiment of the present invention.

FIG. 6 schematically illustrates an exemplary modulating circuit in accordance with an embodiment of the present invention. As shown in FIG. 6, the modulating circuit is configured to comprise a first resistor R1 and a second resistor R2. The first resistor R1 has a first terminal and a second terminal, wherein the first terminal is configured to receive a supply voltage VCC. In one embodiment, the supply voltage VCC may be the bias voltage VBIAS. The second resistor R2 has a first terminal and a second terminal, wherein the first terminal of the second resistor R2 is coupled to the second terminal of the first resistor R1 and is configured to generate the modulating signal MOD, the second terminal of the second resistor R2 is coupled to a reference ground GND. The second resistor R2 has a resistance and the resistance is controlled by the counting signal CT. In one embodiment, the resistance of the second resistor R2 decreases when the counting signal CT counts in the first direction, increases when the counting signal CT counts in the second direction, and keeps unchanged when the counting signal CT keeps unchanged. In one embodiment, the second resistor R2 may be implemented with a plurality of sub-resistors and a plurality of switches. The plurality of switches are controlled by the counting signal CT and are used to control the resistance of the second resistor R2 by enabling or disabling the sub-resistors.

Figure 7:
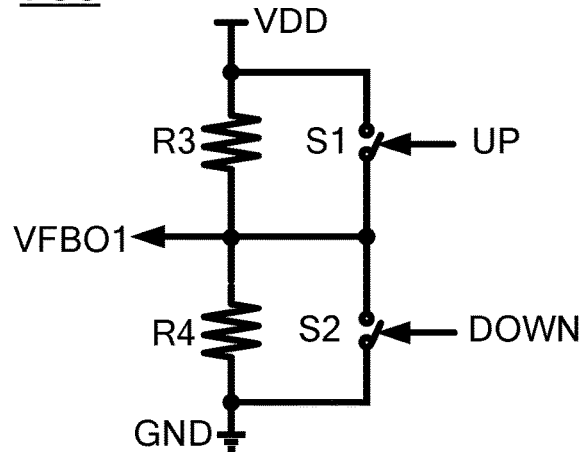
FIG. 7 schematically illustrates a first feedback control circuit 700 in accordance with an embodiment of the present invention.

FIG. 7 schematically illustrates a first feedback control circuit 700 in accordance with an embodiment of the present invention. As shown in FIG. 7, the first feedback control circuit 700 comprises a resistor R3 and a resistor R4, a first switch S1 and a second switch S2. The resistor R3 and the resistor R4 each has a first terminal and a second terminal. The first terminal of the resistor R3 is coupled to a power supply voltage VDD. The first terminal of the resistor R4 is coupled to the second terminal of the resistor R3, and the second terminal of the resistor R4 is coupled to a reference ground GND. The first switch S1 and the second switch S2 each has a first terminal, a second terminal and a control terminal. The first terminal of the first switch S1 is coupled to the first terminal of the resistor R3, the second terminal of the first switch S1 is coupled to the second terminal of the resistor R3, and the control terminal of the first switch S1 is configured to receive the up status signal UP. The first terminal of the second switch S2 is coupled to the first terminal of the resistor R4, the second terminal of the second switch S2 is coupled to the reference ground GND, and the control terminal of the second switch S2 is configured to receive the down status signal DOWN. The first feedback control circuit 700 is configured to generate a first feedback control signal VFBO1 at the second terminal of the resistor R3 and the first terminal of the resistor R4.

In operation, when any of the headroom detecting voltages VLED1 . . . VLEDi . . . VLEDN is lower than the low headroom threshold voltage VTHL or when the downstream feedback signal VFBI is higher than the high downstream threshold voltage VTH2, the up status signal UP is in the active state (e.g. logic "1") and the down status signal DOWN is in the non-active state (e.g. logic "0"), the first switch S1 is turned on and the second switch S2 is turned off, thus the first feedback control signal VFBO1 is equal to the power supply voltage VDD. When each of the headroom detecting voltages VLED1 . . . VLEDi . . . VLEDN is higher than the high headroom threshold voltage VTHH and the downstream feedback signal VFBI is lower than the low downstream threshold voltage VTH1, the up status signal UP is in the non-active state (e.g. logic "0") and the down status signal DOWN is in the active state (e.g. logic "1"), the first switch S1 is turned off and the second switch S2 is turned on, thus the first feedback control signal VFBO1 is equal to the ground voltage. When each of the headroom detecting voltages VLED1 . . . VLEDi . . . VLEDN is between the low headroom threshold voltage VTHL and the high headroom threshold voltage VTHH and the downstream feedback signal VFBI is between the low downstream threshold voltage VTH1 and the high downstream threshold voltage VTH2, the up status signal UP is in the non-active state (e.g. logic "0") and the down status signal DOWN is in the non-active state (e.g. logic "0"), the first switch S1 is turned off and the second switch S2 is turned off, thus the first feedback control signal VFBO1 is equal to VDD×R4/(R3+R4). In one embodiment, the resistance of the resistor R3 and the resistor R4 are set to be equal, thus the first feedback control signal VFBO1 is equal to VDD/2.

Figure 8:
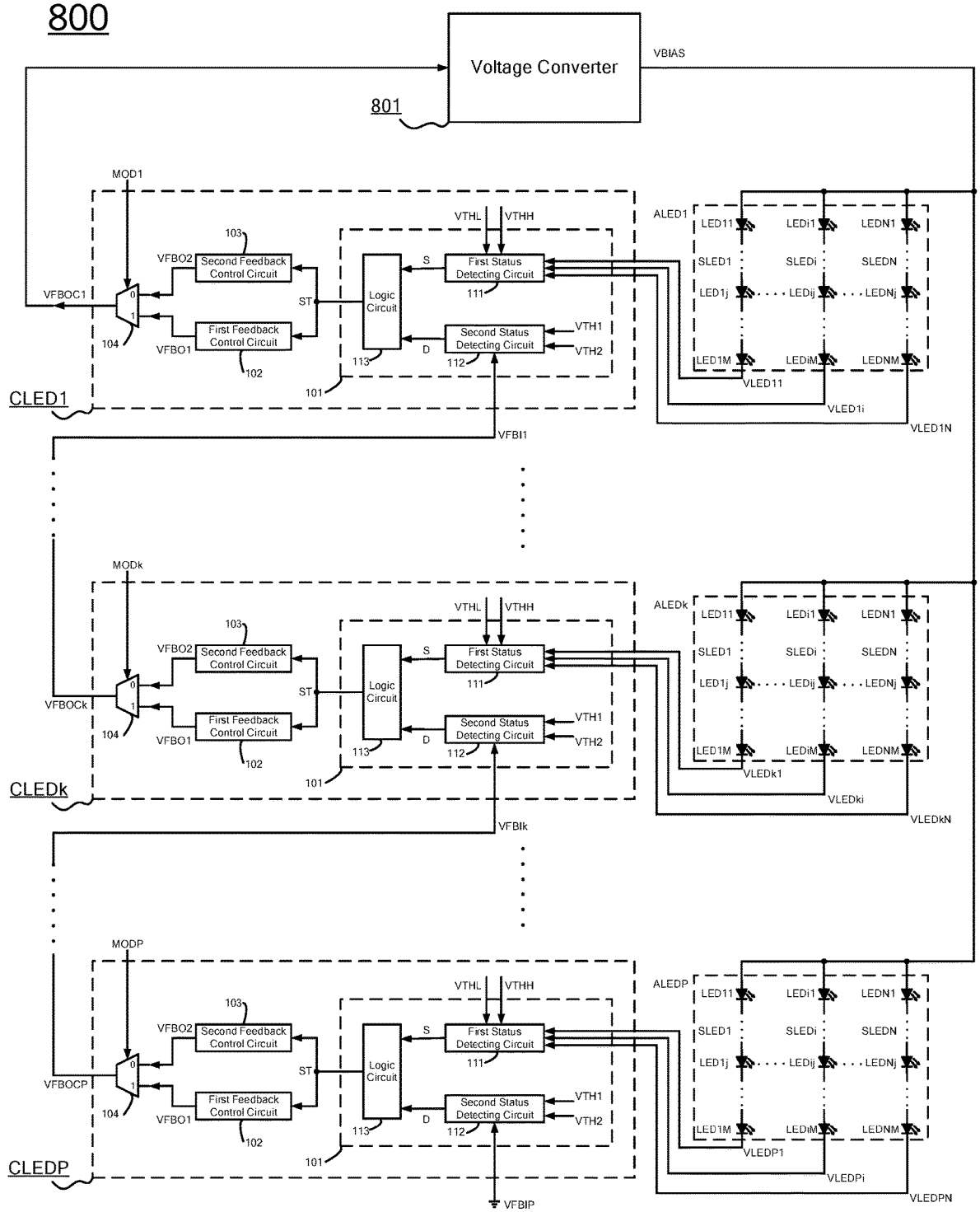
FIG. 8 schematically illustrates an LED driving system 800 in accordance with an embodiment of the present invention.

FIG. 8 schematically illustrates an LED driving system 800 in accordance with an embodiment of the present invention. The LED driving system 800 is configured to comprise a plurality of LED driving circuits CLED1 . . . CLEDk . . . CLEDP, wherein k represents an integer in the range of 1 to P and P represents an integer greater than or equal to 2. As shown in FIG. 8, the LED driving circuit CLEDk is configured to drive an LED array ALEDk which receives a bias voltage VBIAS and provides a plurality of headroom detecting voltages VLEDk1 . . . VLEDki . . . VLEDkN, just in a way as described in the embodiment of FIG. 1.

In the embodiment of FIG. 8, the LED driving circuit CLEDk may be implemented in the context of some or all of the functionalities and/or architectures of the LED driving circuits illustrated in the above embodiments. As can be seen from FIG. 8, the LED driving circuit CLEDk receives a downstream feedback signal VFBIk and provides a feedback control signal VFBOCk. The LED driving circuits CLED1 . . . CLEDk . . . CLED(P-1) are respectively coupled to the LED driving circuits CLED2 . . . CLEDk . . . CLEDP to respectively receive the feedback control signals VFBOC2 . . . VFBOCk . . . VFBOCP as the downstream feedback signals VFBI1 . . . VFBIk . . . VFBI(P-1). In more details, the second status detecting circuits of the LED driving circuits CLED1 . . . CLEDk . . . CLED(P-1) are respectively coupled to the first feedback control circuits of the LED driving circuits CLED2 . . . CLEDk . . . CLEDP to receive the first feedback control signals provided by the LED driving circuits CLED2 . . . CLEDk . . . CLEDP as the downstream feedback signals VFBI1 . . . VFBIk . . . VFBI(P-1) received by the LED driving circuits CLED1 . . . CLEDk . . . CLED(P-1).

As shown in FIG. 8, the LED driving circuit CLED1 is configured as a master LED driving circuit wherein the LED driving circuit CLED1 is connected to a voltage regulator 801 and the feedback control signal VFBOC1 is provided to the voltage regulator 801 so that the voltage regulator 801 generates a bias voltage VBIAS based on the feedback control signal VFBOC1 and provides the bias voltage VBIAS to the plurality of LED arrays ALED1 . . . ALEDk . . . ALEDP as shown in FIG. 8. In the LED driving circuit CLED1, the selecting circuit 104 is configured to receive a mode setting signal MOD1 being in a first state (e.g., coupled to a ground voltage), and based on the mode setting signal MOD1, the selecting circuit 104 is configured to select the second feedback control circuit 103 to output the second feedback control signal VFBO2 as the feedback control signal VFBOC1. The LED driving circuits CLED2 . . . CLEDk . . . CLEDP are configured as slave LED driving circuits wherein the feedback control signals VFBOC2 . . . VFBOCk . . . VFBOCP are respectively provided to the LED driving circuits CLED1 . . . CLEDk . . . CLED(P-1). In the LED driving circuits CLED2 . . . CLEDk . . . CLEDP, the selecting circuits 104 are respectively configured to receive the mode setting signals MOD2 . . . MODk . . . MODP with each being in a second state (e.g., coupled to a power supply voltage), and based on the mode setting signals MOD2 . . . MODk . . . MODP, the selecting circuits 104 are respectively configured to select the first feedback control circuits 102 in the LED driving circuits CLED2 . . . CLEDk . . . CLEDP to output the first feedback control signals VFBO1 respectively served as the feedback control signals VFBOC2 . . . VFBOCk . . . VFBOCP.

In one embodiment, the first feedback control signals VFBO1 generated by the LED driving circuits CLED1 . . . CLEDk . . . CLEDP respectively indicate a status of the LED driving circuits CLED1 . . . CLEDk . . . CLEDP. Yet in another embodiment, the downstream feedback signals VFBI1 . . . VFBIk . . . VFBI(P-1) received by the LED driving circuits CLED1 . . . CLEDk . . . CLED(P-1) are respectively used to indicate that the LED driving circuits CLED1 . . . CLEDk . . . CLED(P-1) are respectively coupled to the LED driving circuits CLED2 . . . CLEDk . . . CLEDP as shown in FIG. 8 and to further indicate a status of the LED driving circuits CLED2 . . . CLEDk . . . CLEDP. As shown in FIG. 8, the LED driving circuit CLEDP is configured as the last slave LED driving circuit of the LED driving system 800, and the downstream feedback signal VFBIP indicates that no downstream LED driving circuit is coupled to the LED driving circuit CLEDP and that the LED driving circuit CLEDP is coupled to the ground voltage.

The operation of the LED driving system 800 will now be set forth with or without the foregoing features optionally incorporated. In the following description of the operation of the LED driving system 800, the first status detecting circuit 111 is implemented with the first status detecting circuit 200 of FIG. 2, the second status detecting circuit 112 is implemented with the second status detecting circuit 300 of FIG. 3, the logic circuit 113 is implemented with the logic circuit 400 of FIG. 4, the first feedback control circuit 102 is implemented with the first feedback control circuit 700 of FIG. 7, the second feedback control circuit 103 is implemented with the second feedback control circuit 500 of FIG. 5, and the selecting circuit 104 is implemented with the selecting circuit 900 of FIG. 9.

During use, the downstream feedback signal VFBIP of the LED driving circuit CLEDP is coupled to the ground voltage (e.g., 0V) which is lower than the low downstream threshold voltage VTH1 (e.g., 0.3V), which in turn results in the up downstream status signal UP_D being in the non-active state and the down downstream status signal DOWN_D being in the active state. Thus, the up status signal UP is determined by the state of the up self-status signal UP_S and the down status signal DOWN is determined by the state of the down self-status signal DOWN_S through the logic operations of the logic circuit 400. When any of the plurality of headroom detecting voltages VLEDP1 . . . VLEDPi . . . VLEDPN received by the LED driving circuit CLEDP is lower than the low headroom threshold voltage VTHL, the up self-status signal UP_S is in the active state and the down self-status signal DOWN_S is in the non-active state, which results in the active state of the up status signal UP and the non-active state of the down status signal DOWN. As the mode selecting signal MODP is in the second state, in the LED driving circuit CLEDP, the first feedback control circuit 700 is selected to output the first feedback control signal VFBO1 as the feedback control signal VFBOCP. And in the first feedback control circuit 700, the first switch S1 is turned on by the active up status signal UP and the second switch S2 is turned off by the non-active down status signal DOWN, thus the first feedback control signal VFBO1, i.e., the feedback control signal VFBOCP, is equal to the power supply voltage VDD. Then no matter whether the plurality of headroom detecting voltages VLED(P-1)1 . . . VLED(P-1)i . . . VLED(P-1)N received by the LED driving circuit CLED(P-1) is lower than the low headroom threshold voltage VTHL or not, as the feedback control signal VFBOCP, i.e., the downstream feedback signal VFBI(P-1), is higher than the high downstream threshold voltage VTH2 (e.g., 0.75V), thus in the LED driving circuit CLED(P-1), the up downstream status signal UP_D is in the active state and the down downstream status signal DOWN_D is in the non-active state and the up status signal UP is in the active state and the down status signal DOWN is in the non-active state through the logic operations of the logic circuit 400. And thus, the feedback control signal VFBOC(P−1) is equal to the power supply voltage VDD. The LED driving circuits CLED2 . . . CLEDk . . . CLED(P−2) operate similarly as the LED driving circuit CLED(P−1) and thus the feedback control signal VFBOC2 is equal to the power supply voltage VDD through the plurality of LED driving circuits CLED2 . . . CLEDk . . . CLED(P−1). Based on the feedback control signal VFBOC2, the feedback control signal VFBOC1 generated by the second feedback control circuit 500 in the LED driving circuit CLED1 is decreased so that the bias voltage regulated by the decreased feedback control signal VFBOC1 increases to an appropriate value to supply the pluralities of LED arrays ALED1 . . . ALEDk . . . ALEDP and none of the plurality of headroom detecting voltages VLEDP1 . . . VLEDPi . . . VLEDPN received by the LED driving circuit CLEDP is lower than the low headroom threshold voltage VTHL.

Similarly, when any of the pluralities of headroom detecting voltages received by the LED driving circuits CLED1 . . . CLEDk . . . CLEDP is lower than the low headroom threshold voltage VTHL, the up self-status signal UP_S in the corresponding LED driving circuit is in the active state and the down self-status signal DOWN_S in the corresponding LED driving circuit is in the non-active state, which results in the active state of the up status signal UP and the non-active state of the down status signal DOWN through the logic operations of the logic circuit 400 in the corresponding LED driving circuit and further makes the feedback control signal VFBOC2 be equal to the power supply voltage VDD. Based on the feedback control signal VFBOC2, the feedback control signal VFBOC1 generated by the second feedback control circuit 500 in the LED driving circuit CLED1 is decreased so that the bias voltage regulated by the decreased feedback control signal VFBOC1 increases to an appropriate value to supply the pluralities of LED arrays ALED1 . . . ALEDk . . . ALEDP.

When all of the pluralities of headroom detecting voltages received by the LED driving circuits CLED1 . . . CLEDk . . . CLEDP are higher than the high headroom threshold voltage VTHH, the up self-status signal UP_S is in the non-active state and the down self-status signal DOWN_S is in the active state, which results in the active state of the down status signal DOWN and the non-active state of the up status signal UP in each LED driving circuit. With the first feedback control circuit 700, the first switch S1 is turned off by the non-active up status signal UP and the second switch S2 is turned on by the active down status signal DOWN, thus the first feedback control signal VFBO1 in each LED driving circuit is equal to the ground voltage. Based on the feedback control signal VFBOC2, the second feedback control circuit 500 generates the feedback control signal VFBOC1 with its value increased so that the bias voltage regulated by the increased feedback control signal VFBOC1 decreases to an appropriate value to supply the pluralities of LED arrays ALED1 . . . ALEDk . . . ALEDP.

When all of the pluralities of headroom detecting voltages VLED1 VLEDi . . . VLEDN received by the LED driving circuits CLED1 . . . CLEDk . . . CLEDP are between the low headroom threshold voltage VTHL and the high headroom threshold voltage VTHH, the up self-status signals UP_S of the LED driving circuits CLED1 . . . CLEDk . . . CLEDP are in the non-active state and the down self-status signals DOWN_S of the LED driving circuits CLED1 . . . CLEDk . . . CLEDP are in non-the active state, and besides, the up downstream signals UP_D and the down downstream signals DOWN_D are in the non-active state, which results in the non-active state of the down status signal DOWN and the non-active state of the up status signal UP. With the first feedback control circuit 700, the first switch S1 is turned off by the non-active up status signal UP and the second switch S2 is turned off by the non-active down status signal DOWN, thus the first feedback control signal VFBO1 in each LED driving circuit is equal to VDD/2. Based on the feedback control signal VFBOC2, the second feedback control circuit 500 generates the feedback control signal VFBOC1 with its value kept unchanged so that the bias voltage regulated by the feedback control signal VFBOC1 keeps unchanged and is an appropriate value for supplying the pluralities of LED arrays ALED1 . . . ALEDk . . . ALEDP.

The LED driving system of the present invention is configured as a master-salve architecture, and the downstream LED driving circuit passes its own status to the upstream LED driving circuit all the way along until to the LED driving circuit CLED1. In this way, the status of all the LED driving circuits are considered and an appropriate bias voltage can thus be obtained to supply the pluralities of LED strings driven by the LED driving circuits CLED1 . . . CLEDk . . . CLEDP. The LED driving system of the present invention has a simple architecture as well as a high efficiency.

It will be appreciated by persons skilled in the art that the present invention is not limited to what has been particularly shown and described herein above. Rather the scope of the present invention is defined by the appended claims and includes both combinations and sub-combinations of the various features described hereinabove as well as variations and modifications thereof which would occur to persons skilled in the art upon reading the foregoing description and which are not in the prior art.

What is claimed is:

1. An LED (Light Emitting Diode) driving circuit for driving a plurality of LED strings, wherein each LED string has a first terminal and a second terminal, and the plurality of LED strings receive a bias voltage at the first terminals and provide at the second terminals a plurality of headroom detecting voltages having a one-to-one correspondence with the second terminals of the plurality of LED strings, the LED driving circuit comprising:
   a first status detecting circuit configured to receive the plurality of headroom detecting voltages and to generate at least one self-status signal based on the plurality of headroom detecting voltages;
   a second status detecting circuit configured to receive a downstream feedback signal and to generate at least one downstream status signal based on the downstream feedback signal, wherein the downstream feedback signal indicates whether a downstream LED driving circuit is coupled to the LED driving circuit or not and further indicates a status of the downstream LED driving circuit if the downstream LED driving circuit is coupled to the LED driving circuit; and
   a first feedback control circuit configured to generate a first feedback control signal based on the at least one self-status signal and the at least one downstream status signal, wherein the first feedback control signal indicates a status of the LED driving circuit.

2. The LED driving circuit of claim 1, wherein the first feedback control signal has a first value when any of the headroom detecting voltages is lower than a low headroom threshold voltage or the downstream feedback signal is higher than a high downstream threshold voltage, the first feedback control signal has a second value when each of the headroom detecting voltages is higher than a high headroom threshold voltage and the downstream feedback signal is lower than a low downstream threshold voltage, and the first feedback control signal has a third value when each of the headroom detecting voltages is between the low headroom threshold voltage and the high headroom threshold voltage and the downstream feedback signal is between the low downstream threshold voltage and the high downstream threshold voltage.

3. The LED driving circuit of claim 1,
wherein the at least one self-status signal comprises an up self-status signal and a down self-status signal, and the first status detecting circuit is configured to generate the up self-status signal based on comparing each headroom detecting voltage with a low headroom threshold voltage and to generate the down self-status signal based on comparing each headroom detecting voltage with a high headroom threshold voltage, and wherein the at least one downstream status signal comprises an up downstream status signal and a down downstream status signal, and the second status detecting circuit is configured to generate the up downstream status signal based on comparing the downstream feedback signal with a high downstream threshold voltage and to generate the down downstream status signal based on comparing the downstream feedback signal with a low downstream threshold voltage; and
wherein the first feedback control circuit is configured to generate the first feedback control signal based on the up self-status signal, the down self-status signal, the up downstream status signal and the down downstream status signal.

4. The LED driving circuit of claim 3, wherein the first feedback control circuit comprises:
a first resistor having a first terminal and a second terminal, wherein the first terminal of the first resistor is configured to receive a supply voltage;
a second resistor having a first terminal and a second terminal, wherein the first terminal of the second resistor is coupled to the second terminal of the first resistor and is configured to generate the first feedback control signal, and the second terminal of the second resistor is coupled to a reference ground;
a first switch having a first terminal, a second terminal and a control terminal, wherein the first terminal of the first switch is coupled to the first terminal of the first resistor, the second terminal of the first switch is coupled to the second terminal of the first resistor, and the control terminal of the first switch is controlled by the up self-status signal and the up downstream status signal; and
a second switch having a first terminal, a second terminal and a control terminal, wherein the first terminal of the second switch is coupled to the second terminal of the first resistor, the second terminal of the second switch is coupled to the reference ground, and the control terminal of the second switch is controlled by the down self-status signal and the down downstream status signal.

5. The LED driving circuit of claim 3, wherein the LED driving circuit further comprises a logic circuit, and wherein the logic circuit comprises:

an OR gate having a first input terminal, a second input terminal and an output terminal, wherein the first input terminal of the OR gate is coupled to the first status detecting circuit to receive the up self-status signal and the second input terminal of the OR gate is coupled to the second status detecting circuit to receive the up downstream status signal, and based on the up self-status signal and the up downstream status signal, the OR gate generates an up status signal; and
an AND gate having a first input terminal, a second input terminal and an output terminal, wherein the first input terminal of the AND gate is coupled to the first status detecting circuit to receive the down self-status signal and the second input terminal of the AND gate is coupled to the second status detecting circuit to receive the down downstream status signal, and based on the down self-status signal and the down downstream status signal, the AND gate generates a down status signal;
wherein the first feedback control circuit is configured to generate the first feedback control signal based on the up status signal and the down status signal.

6. The LED driving circuit of claim 1, wherein the downstream feedback signal has the same value as the value of the first feedback control signal when the downstream LED driving circuit has the same status as the status of the LED driving circuit.

7. The LED driving circuit of claim 1, wherein the downstream LED driving circuit has the same configuration as the configuration of the LED driving circuit.

8. An LED (Light Emitting Diode) driving circuit for driving a plurality of LED strings, wherein each LED string has a first terminal and a second terminal, and the plurality of LED strings receive a bias voltage at the first terminals and provide at the second terminals a plurality of headroom detecting voltages having a one-to-one correspondence with the second terminals of the plurality of LED strings, the LED driving circuit comprising:
a status detecting circuit configured to receive the plurality of headroom detecting voltages and a downstream feedback signal and to generate at least one status signal based on the plurality of headroom detecting voltages and the downstream feedback signal;
a first feedback control circuit configured to generate a first feedback control signal based on the at least one status signal;
a second feedback control circuit configured to generate a second feedback control signal based on the at least one status signal; and
a selecting circuit configured to receive a mode setting signal, wherein based on the mode setting signal, the selecting circuit is configured to select the first feedback control circuit to output the first feedback control signal or the second feedback control circuit to output the second feedback control signal.

9. The LED driving circuit of claim 8, wherein the at least one status signal comprises an up self-status signal, a down self-status signal, an up downstream status signal and a down downstream status signal, and the status detecting circuit comprises:
a first status detecting circuit configured to receive the plurality of headroom detecting voltages, a low headroom threshold voltage and a high headroom threshold voltage and to generate the up self-status signal based on comparing each headroom detecting voltage with the low headroom threshold voltage and to generate the down self-status signal based on comparing each headroom detecting voltage with the high headroom threshold voltage; and a second status detecting circuit configured to receive the downstream feedback signal, a low downstream threshold voltage and a high downstream threshold voltage and to generate the up downstream status signal based on comparing the downstream feedback signal with the high downstream threshold voltage and to generate the down downstream status signal based on comparing the downstream feedback signal with the low downstream threshold voltage;

wherein the first feedback control circuit and the second feedback control circuit are respectively configured to generate the first feedback control signal and the second feedback control signal based on the up self-status signal, the down self-status signal, the up downstream status signal and the down downstream status signal.

10. The LED driving circuit of claim 9, wherein the LED driving circuit further comprises a logic circuit, and wherein the logic circuit comprises:

an OR gate having a first input terminal, a second input terminal and an output terminal, wherein the first input terminal of the OR gate is coupled to the first status detecting circuit to receive the up self-status signal and the second input terminal of the OR gate is coupled to the second status detecting circuit to receive the up downstream status signal, and based on the up self-status signal and the up downstream status signal, the OR gate generates an up status signal; and an AND gate having a first input terminal, a second input terminal and an output terminal, wherein the first input terminal of the AND gate is coupled to the first status detecting circuit to receive the down self-status signal and the second input terminal of the AND gate is coupled to the second status detecting circuit to receive the down downstream status signal, and based on the down self-status signal and the down downstream status signal, the AND gate generates a down status signal;

wherein the first feedback control circuit and the second feedback control circuit are respectively configured to generate the first feedback control signal and the second feedback control signal based on the up status signal and the down status signal.

11. The LED driving circuit of claim 8, wherein the mode setting signal is in a first state and the second feedback control circuit is selected to output the second feedback control signal by the mode setting signal, and wherein the LED driving circuit is connected to a voltage regulator providing the bias voltage and the second feedback control signal is provided to the voltage regulator for regulating the bias voltage.

12. The LED driving circuit of claim 8, wherein the mode setting signal is in a second state and the first feedback control circuit is selected to output the first feedback control signal by the mode setting signal, and wherein the LED driving circuit is coupled to an upstream LED driving circuit and the second feedback control signal is provided to the upstream LED driving circuit.

13. The LED driving circuit of claim 8, wherein the first feedback control signal has a first value when any of the headroom detecting voltages is lower than a low headroom threshold voltage or the downstream feedback signal is higher than a high downstream threshold voltage, the first feedback control signal has a second value when each of the headroom detecting voltages is higher than a high headroom threshold voltage and the downstream feedback signal is lower than a low downstream threshold voltage, and the first feedback control signal has a third value when each of the headroom detecting voltages is between the low headroom threshold voltage and the high headroom threshold voltage and the downstream feedback signal is between the low downstream threshold voltage and the high downstream threshold voltage.

14. The LED driving circuit of claim 8, wherein the first feedback control circuit comprises:

a first resistor having a first terminal and a second terminal, wherein the first terminal of the first resistor is configured to receive a supply voltage;

a second resistor having a first terminal and a second terminal, wherein the first terminal of the second resistor is coupled to the second terminal of the first resistor and is configured to generate the first feedback control signal, and the second terminal of the second resistor is coupled to a reference ground;

a first switch having a first terminal, a second terminal and a control terminal, wherein the first terminal of the first switch is coupled to the first terminal of the first resistor, the second terminal of the first switch is coupled to the second terminal of the first resistor, and the control terminal of the first switch is controlled by the at least one status signal; and a second switch having a first terminal, a second terminal and a control terminal, wherein the first terminal of the second switch is coupled to the second terminal of the first resistor, the second terminal of the second switch is coupled to the reference ground, and the control terminal of the second switch is controlled by the at least one status signal.

15. The LED driving circuit of claim 8, wherein the second feedback control circuit comprises:

a counting circuit configured to generate a counting signal counting in a first direction or in a second direction opposite to the first direction or keeping unchanged based on the at least one status signal;

a modulating circuit configured to generate a modulating signal varying with the counting signal; and a buffer having a first input terminal, a second input terminal and an output terminal, wherein the first input terminal is coupled to the modulating circuit to receive the modulating signal, and the output terminal is coupled to the second input terminal and is configured to provide a buffer signal, and wherein the second feedback control signal is generated based on the buffer signal.

16. The LED driving circuit of claim 8, wherein the downstream feedback signal indicates whether a downstream LED driving circuit is coupled to the LED driving circuit or not and further indicates a status of the downstream LED driving circuit if the downstream LED driving circuit is coupled to the LED driving circuit, and wherein the first feedback control signal indicates a status of the LED driving circuit.

17. An LED (Light Emitting Diode) driving system, comprising:

a first LED driving circuit and a second LED driving circuit with each comprising an LED driving circuit, wherein the LED driving circuit is configured to drive a plurality of LED strings, each LED string has a first terminal and a second terminal, and the plurality of LED strings receive a bias voltage at the first terminals and provide at the second terminals a plurality of headroom detecting voltages having a one-to-one correspondence with the second terminals of the plurality of LED strings, and wherein the LED driving circuit comprises:
- a first status detecting circuit configured to receive the plurality of headroom detecting voltages and to generate at least one self-status signal based on the plurality of headroom detecting voltages;
- a second status detecting circuit configured to receive a downstream feedback signal and to generate at least one downstream status signal based on the downstream feedback signal; and
- a first feedback control circuit configured to generate a first feedback control signal based on the at least one self-status signal and the at least one downstream status signal;
- wherein the second status detecting circuit of the first LED driving circuit is coupled to the first feedback control circuit of the second LED driving circuit to receive the first feedback control signal provided by the second LED driving circuit as the downstream feedback signal received by the first LED driving circuit.

18. The LED driving system of claim 17, wherein the downstream feedback signal received by the first LED driving circuit indicates a status of the second LED driving circuit.

19. The LED driving system of claim 17, wherein the first feedback control signal provided by the second LED driving circuit has a first value when any of the headroom detecting voltages received by the second LED driving circuit is lower than a low headroom threshold voltage or the downstream feedback signal received by the second LED driving circuit is higher than a high downstream threshold voltage, the first feedback control signal provided by the second LED driving circuit has a second value when each of the headroom detecting voltages received by the second LED driving circuit is higher than a high headroom threshold voltage and the downstream feedback signal received by the second LED driving circuit is lower than a low downstream threshold voltage, and the first feedback control signal provided by the second LED driving circuit has a third value when each of the headroom detecting voltages received by the second LED driving circuit is between the low headroom threshold voltage and the high headroom threshold voltage and the downstream feedback signal received by the second LED driving circuit is between the low downstream threshold voltage and the high downstream threshold voltage.

20. The LED driving system of claim 17,
wherein the at least one self-status signal comprises an up self-status signal and a down self-status signal, and the first status detecting circuit is configured to generate the up self-status signal based on comparing each headroom detecting voltage with a low headroom threshold voltage and to generate the down self-status signal based on comparing each headroom detecting voltage with a high headroom threshold voltage, and wherein the at least one downstream status signal comprises an up downstream status signal and a down downstream status signal, and the second status detecting circuit is configured to generate the up downstream status signal based on comparing the downstream feedback signal with a low downstream threshold voltage and to generate the down downstream status signal based on comparing the downstream feedback signal with a high downstream threshold voltage; and
wherein the first feedback control circuit is configured to generate the first feedback control signal based on the up self-status signal, the down self-status signal, the up downstream status signal and the down downstream status signal.

21. The LED driving system of claim 20, wherein the LED driving circuit further comprises a logic circuit, and wherein the logic circuit comprises:
- an OR gate having a first input terminal, a second input terminal and an output terminal, wherein the first input terminal of the OR gate is coupled to the first status detecting circuit to receive the up self-status signal and the second input terminal of the OR gate is coupled to the second status detecting circuit to receive the up downstream status signal, and based on the up self-status signal and the up downstream status signal, the OR gate generates an up status signal at the output terminal of the OR gate; and
- an AND gate having a first input terminal, a second input terminal and an output terminal, wherein the first input terminal of the AND gate is coupled to the first status detecting circuit to receive the down self-status signal and the second input terminal of the AND gate is coupled to the second status detecting circuit to receive the down downstream status signal, and based on the down self-status signal and the down downstream status signal, the AND gate generates a down status signal at the output terminal of the AND gate;
- wherein the first feedback control circuit is configured to generate the first feedback control signal based on the up status signal and the down status signal.

22. The LED driving system of claim 17, wherein the LED driving circuit further comprises:
- a second feedback control circuit configured to generate a second feedback control signal based on the at least one self-status signal and the at least one downstream status signal; and
- a selecting circuit configured to receive a mode setting signal, wherein based on the mode setting signal, the selecting circuit is configured to select the first feedback control circuit to output the first feedback control signal or the second feedback control circuit to output the second feedback control signal.

23. The LED driving system of claim 22, wherein the first LED driving circuit is connected to a voltage regulator providing the bias voltage and the second feedback control circuit of the first LED driving circuit is selected to output the second feedback control signal to the voltage regulator to regulate the bias voltage.

* * * * *